United States Patent
Harada

(10) Patent No.: US 9,316,372 B2
(45) Date of Patent: Apr. 19, 2016

(54) LIGHT EMITTING DEVICE AND VEHICLE LAMP

(71) Applicant: Stanley Electric Co., Ltd., Tokyo (JP)

(72) Inventor: Mitsunori Harada, Tokyo (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 138 days.

(21) Appl. No.: 14/099,898

(22) Filed: Dec. 6, 2013

(65) Prior Publication Data

US 2014/0160782 A1   Jun. 12, 2014

(30) Foreign Application Priority Data

Dec. 6, 2012   (JP) .................................. 2012-267022

(51) Int. Cl.

| | |
|---|---|
| *F21V 9/16* | (2006.01) |
| *F21S 8/10* | (2006.01) |
| *F21K 99/00* | (2010.01) |
| *F21V 5/00* | (2015.01) |
| *F21Y 101/02* | (2006.01) |

(52) U.S. Cl.
CPC ............... *F21S 48/1145* (2013.01); *F21K 9/56* (2013.01); *F21V 5/008* (2013.01); *F21Y 2101/025* (2013.01)

(58) Field of Classification Search
CPC ........... F21Y 2101/02; F21Y 2101/025; F21S 48/10; F21K 9/56; F21V 5/008
See application file for complete search history.

(56) References Cited

U.S. PATENT DOCUMENTS

| | | | | | |
|---|---|---|---|---|---|
| 7,600,924 | B2 * | 10/2009 | Hama | .................. | G02B 6/4298 385/58 |
| 8,783,969 | B2 * | 7/2014 | Kuboi | .................. | G02B 6/0003 385/141 |
| 8,872,203 | B2 * | 10/2014 | Nagahama | ............ | H01L 33/483 257/98 |
| 2011/0157865 | A1 * | 6/2011 | Takahashi | ................. | F21K 9/56 362/84 |
| 2011/0279007 | A1 * | 11/2011 | Kishimoto | ........... | B60Q 1/0011 313/45 |

FOREIGN PATENT DOCUMENTS

JP   2010-165834 A   7/2010

* cited by examiner

*Primary Examiner* — Peggy Neils
(74) *Attorney, Agent, or Firm* — Kenealy Vaidya LLP

(57) ABSTRACT

A light emitting device can include a head portion including a surface including a convex portion, a back surface on the opposite side, and a through hole penetrating a tip surface of the convex portion and the back surface; a light-transmitting member including a surface and a back surface on the opposite side, the back surface including a first recess to be fitted to the convex portion; an adhesive bonding part of the surface of the head portion around the convex portion to the back surface of the light-transmitting member while the convex portion is fitted to the first recess and the first recess covers the through hole; a semiconductor light emitting element that emits light passing through the through hole for irradiation of the light-transmitting member; and an optical system condensing the light from the semiconductor light emitting element and locally irradiates the light-transmitting member with the light.

23 Claims, 11 Drawing Sheets

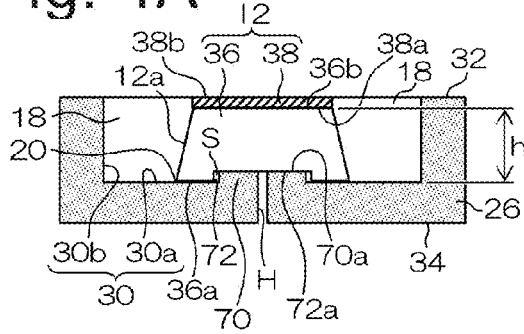
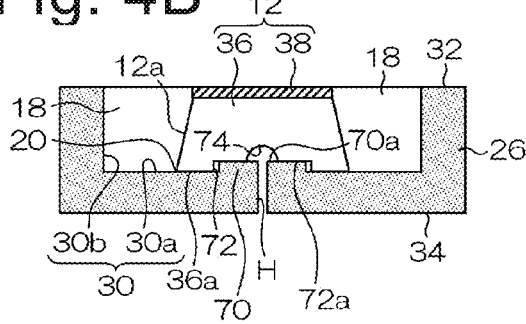
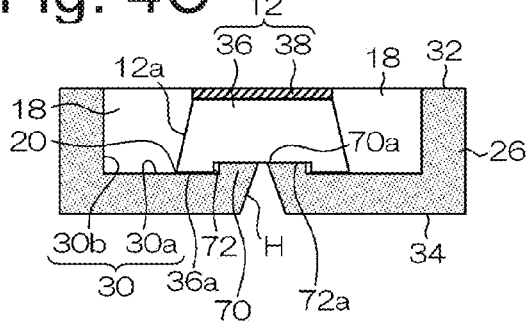
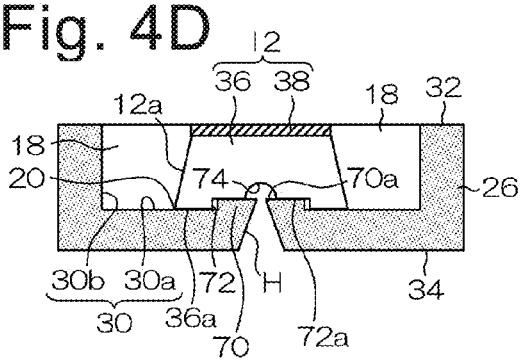
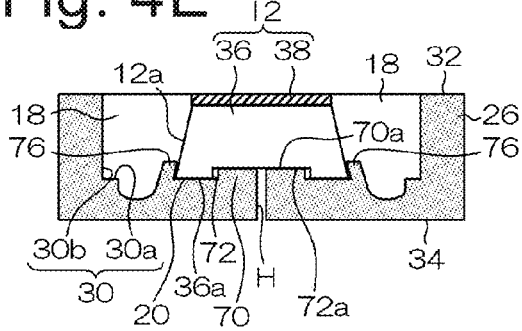

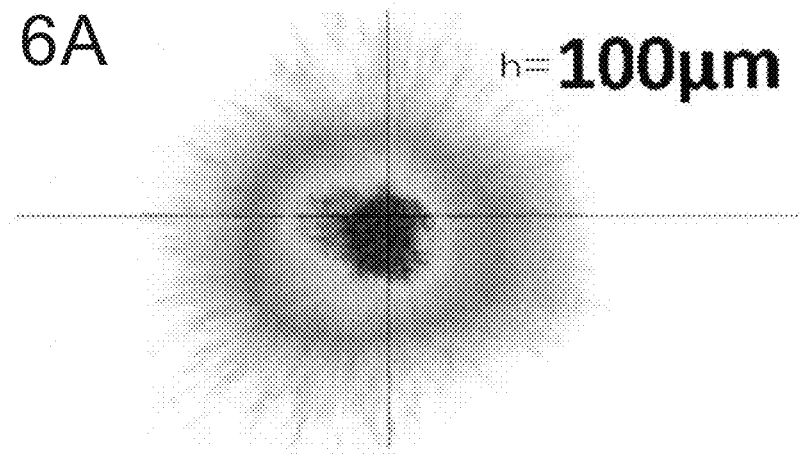
Fig. 6A  h=100μm
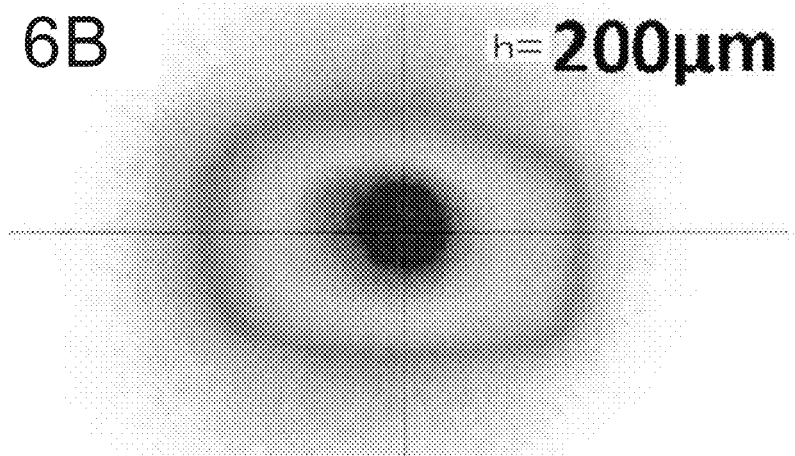
Fig. 6B  h=200μm
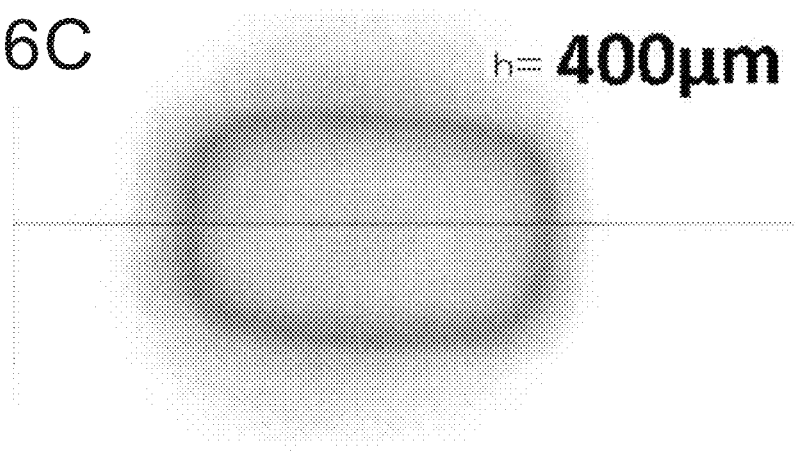
Fig. 6C  h=400μm

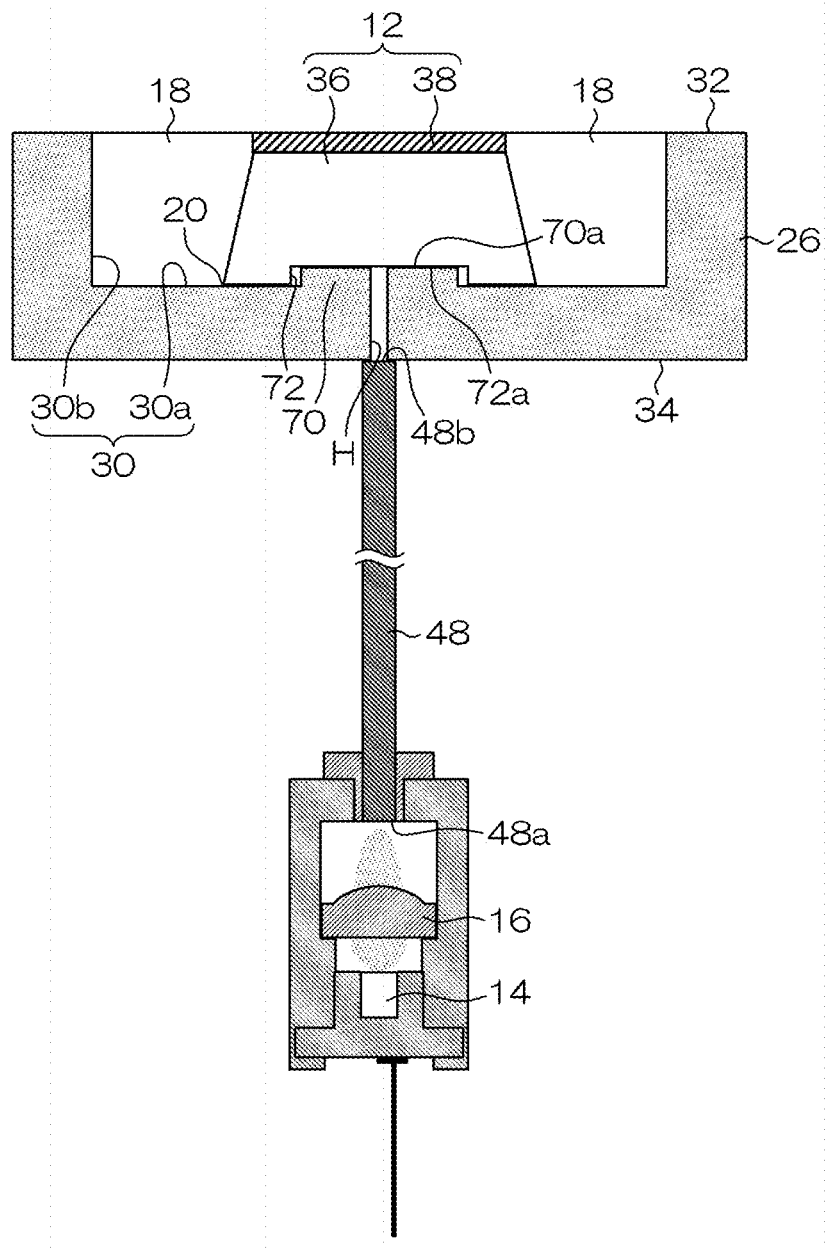

LIGHT EMITTING DEVICE AND VEHICLE LAMP

This application claims the priority benefit under 35 U.S.C. §119 of Japanese Patent Application No. 2012-267022 filed on Dec. 6, 2012, which is hereby incorporated in its entirety by reference.

TECHNICAL FIELD

The presently disclosed subject matter relates to a light emitting device, and more particularly to a light emitting device and a vehicle lamp having a structure in which a semiconductor light emitting element (for example, semiconductor laser light source) and a light-transmitting member are combined with each other.

BACKGROUND ART

A light emitting device having a structure that a semiconductor light emitting element (for example, semiconductor laser light source) and a light-transmitting member are combined with each other has heretofore been proposed (for example, see Japanese Patent Application Laid-Open No. 2010-165834).

As shown in FIG. 1, a light emitting device 200 described in Japanese Patent Application Laid-Open No. 2010-165834 can include a semiconductor laser light source 210, a light-transmitting member 220 (containing phosphor), a condenser lens 230, a holder 240, and other members. The light-transmitting member 220 can be located at a distance from the semiconductor laser light source 210. The condenser lens 230 can be arranged between the semiconductor laser light source 210 and the light-transmitting member 220. The holder 240 can hold the semiconductor laser light source 210, the light-transmitting member 220, and the condenser lens 230.

In the light emitting device 200 described in Japanese Patent Application Laid-Open No. 2010-165834, the laser light from the semiconductor laser light source 210 can be condensed by the condenser lens 230 and pass through a through hole 242. The light-transmitting member 220 arranged over the through hole 242 can be locally irradiated with the laser light. The light-transmitting member 220 irradiated with the laser light can emit both the transmitted laser light from the semiconductor laser light source 210 and light (luminescence) that is emitted due to excitation of phosphor by the laser light from the semiconductor laser light source 210. From the viewpoint of preventing the light-transmitting member 220 from falling off and allowing the laser light to be directly emitted to outside, the light-transmitting member 220 is firmly fixed by a fixing member 250.

According to the light emitting device 200 having the above configuration, when an adhesive is applied to the light-transmitting member 220 (lower surface) and/or the holder 240 (the surface on which the light-transmitting member 220 is mounted) and the light-transmitting member 220 is urged against the holder 240 for bonding, the adhesive with fluidity is spread therebetween to reach the through hole 242. Then, the adhesive may enter the through hole 242. In this case, there is a problem in that the adhesive may get burned due to the laser light emitted from the semiconductor laser light source 210 and passing through the through hole 242.

SUMMARY

The presently disclosed subject matter was devised in view of these and other problems and features in association with the conventional art. According to an aspect of the presently disclosed subject matter, a light emitting device and a vehicle lamp utilizing the light emitting device can prevent the adhesive for bonding a light-transmitting member and a head portion from entering the through hole (through which the light emitted from the semiconductor light emitting element passes).

According to another aspect of the presently disclosed subject matter, a light emitting device can include: a head portion configured to include a surface including a convex portion having a tip surface, a back surface on the opposite side, and a through hole penetrating the tip surface of the convex portion and the back surface; a light-transmitting member configured to include a surface and a back surface on the opposite side, the back surface including a first recess to be fitted to the convex portion, the first recess having a bottom surface; a bonding material that bonds part of the surface of the head portion around the convex portion to the back surface of the light-transmitting member while the convex portion is fitted to the first recess and the bottom surface of the first recess covers the through hole; a semiconductor light emitting element configured to emit light that passes through the through hole and is used to irradiate the light-transmitting member; and an optical system configured to condense the light from the semiconductor light emitting element and locally irradiate the light-transmitting member with the light.

The presently disclosed subject matter according to the above described aspect can provide the following advantages.

Firstly, the light emitting device can prevent the bonding material such as an adhesive for bonding the light-transmitting member (the back surface) and the head portion (the front surface) from entering the through hole (through which the light emitted from the semiconductor light emitting element passes). This advantage results from the fact that the head portion includes the convex portion and the light-transmitting member includes the first recess to be fitted to the convex portion.

When an adhesive is applied to the light-transmitting member (the back surface) and/or the head portion (the front surface) and the light-transmitting member is urged against the head portion for bonding, the adhesive with fluidity may be spread therebetween to reach the through hole. However, since the head portion includes the convex portion and the light-transmitting member includes the first recess to be fitted to the convex portion, this can prevent the adhesive from creeping up. As a result, the adhesive can be prevented from reaching the through hole and entering the through hole (through which the light emitted from the semiconductor light emitting element passes).

Secondly, the positioning of the light-transmitting member to the head portion can be facilitated. This advantage results from the fact that convex portion of the head portion and the first recess of the light-transmitting member together function as a positioning means.

Thirdly, a heat dissipation pathway can be ensured for the heat generated due to the light for use in local irradiation from the semiconductor light emitting element (for example, semiconductor laser light source). This advantage results from the fact that the bonding material (an adhesive) bonding the light-transmitting member (the back surface) and the head portion (the front surface) can enhance the adhesion between the light-transmitting member (the back surface) and the head portion (the front surface) and the contact heat resistance due to the gap therebetween can be reduced.

Fourthly, even when the adhesive or the like deteriorates, the light-transmitting member can be prevented from peeling and falling off. This advantage results from the fact that the convex portion of the head portion can be fit to the first recess of the light-transmitting member.

In the above described aspect of the presently disclosed subject matter, the light emitting device can further include a high reflectance member configured to cover at least part of a side surface of the light-transmitting member.

With the present configuration, the light output efficiency can be improved. This effect results from the fact that since the side surface of the light-transmitting member can be covered with the high reflectance member, light emitted from the side surface of the light-transmitting member is reflected from the high reflectance member to enter the light-transmitting member again.

In the above described aspect of the presently disclosed subject matter, the high reflectance member can be a white resin.

With this configuration, the light output efficiency can be improved. This effect results from the fact that since the side surface of the light-transmitting member can be covered with the white resin, the light emitted from the side surface of the light-transmitting member is reflected from the white resin to enter the light-transmitting member again.

In the above described aspect of the presently disclosed subject matter, the surface of the head portion can include a second recess including a bottom surface including the convex portion formed therein, the bonding material can bond the part of the bottom surface of the second recess around the convex portion to the back surface of the light-transmitting member while the convex portion is fitted to the first recess and the bottom surface of the first recess covers the through hole, and the high reflectance member can be disposed within a space surrounded by the inner walls and the bottom surface of the second recess, and the side surface of the light-transmitting member.

With this configuration, the high reflectance member can be held within the space so as to be less likely to fall off. This advantage results from the fact that the high reflectance member is in close contact with the inner walls and the bottom surface of the second recess and the side surface of the light-transmitting member.

In the above described aspect of the presently disclosed subject matter, the bottom surface of the light-transmitting member can include a third recess that can reflect light emitted from the semiconductor light emitting element and being incident thereon in directions other than the direction in which the light is incident thereon.

With the present configuration, the following advantage can be obtained.

Firstly, the light incident efficiency of light for use in local irradiation from the semiconductor light emitting element to be incident on the back surface of the light-transmitting member can be enhanced. This advantage results from the fact that the light for use in local irradiation from the semiconductor light emitting element can be diffused by the third recess.

Secondly, the bonding material such as an adhesive can be prevented from adhering to the portion of the back surface of the light-transmitting member where the light for use in local irradiation from the semiconductor light emitting element can be incident. This advantage results from the fact that even when the bonding material such as an adhesive enters the tip surface of the convex portion through a gap between the convex portion (the side surface) and a diffusion portion (the side surface), the entering bonding material cannot go up to the third recess.

Thirdly, the light reflected from the third recess (the light component of the first excitation light being reflected from the third recess and returned to the back surface) can be prevented from passing through the through hole and returning to the semiconductor light emitting element or area therearound. This advantage results from the fact that the light reflected from the third recess can repeatedly diffuse between the third recess and the tip surface of the convex portion.

In the above described aspect of the presently disclosed subject matter, the side surface of the light-transmitting member can be inclined inward from the back surface of the light-transmitting member to the surface of the light-transmitting member.

With this configuration, even if the bonding material such as an adhesive deteriorates, the light-transmitting member can be prevented from falling off due to peeling. This advantage results from the fact that the inwardly inclined side surface of the light-transmitting member can function as a falling-off prevention means of the light-transmitting member.

In the above described aspect of the presently disclosed subject matter, the light emitting device can further include a fixing unit arranged to surround the side surface of the light-transmitting member, for fixing the light-transmitting member while being fitted to the side surface of the light-transmitting member.

With this configuration, the light-transmitting member can be strongly fixed, thereby configuring the head portion with high reliability against heat shock and vibration. Further, even if the bonding material such as an adhesive deteriorates, the light-transmitting member can be prevented from peeling and falling off.

The fixing unit can be configured as part of the head portion or a separate member from the head portion.

In the above described aspect of the presently disclosed subject matter, the through hole can be configured to increase in size from the front surface of the head portion to the back surface of the head portion.

With the present configuration, the following advantage can be obtained.

Firstly, the light incident efficiency of light for use in local irradiation from the semiconductor light emitting element to be incident on the back surface of the light-transmitting member can be enhanced. This advantage results from the fact that the through hole is configured to increase in size from the front surface of the head portion to the back surface of the head portion, it is possible to prevent part of light passing through the through hole from the semiconductor light emitting element from being shielded by the inner wall of the through hole.

Secondly, even if the optical axis of the semiconductor light emitting element is offset from a desired center, the light from the semiconductor light emitting element can pass through the through hole without being shielded, thereby improving the yield in an optical axis adjustment process.

In the above described aspect of the presently disclosed subject matter, the light-transmitting member can be a wavelength conversion member including a diffusion layer and a wavelength conversion layer; the diffusion layer can be a layer that can include a first surface including the first recess formed therein and a second surface on the opposite side and can diffuse the light from the semiconductor light emitting element with which the first surface is irradiated, so as to emit the resultant as diffusion light from the second surface; the wavelength conversion layer can be a layer that can include a third surface joined to the second surface and a fourth surface on the opposite side, and can convert a wavelength of the diffusion light incident on the third surface, so as to emit the resultant from the fourth surface; and the bonding material can bond the part of the surface of the head portion around the convex portion to the first surface of the diffusion layer while the convex portion is fitted to the first recess and the bottom surface of the first recess covers the through hole.

With this configuration, a drop in efficiency due to luminance saturation and temperature quenching can be suppressed. This effect results from the fact that the light from the semiconductor light emitting element condensed by the optical system (for example, a condenser lens) is not incident on the wavelength conversion layer as local light. Instead, the light can be diffused by the diffusion layer and incident on the wavelength conversion layer as diffusion light having a generally uniform luminance distribution.

The luminance saturation refers to a phenomenon in which a fluorescence intensity does not increase with an increasing energy density of light (for example, laser light from a semiconductor laser light source) if the energy density of the light exceeds a certain value. The temperature quenching refers to a phenomenon in which the efficiency of the phosphor itself decreases due to heat generated by light (for example, laser light from a semiconductor laser light source) when the phosphor is excited by a high energy density like that of the semiconductor laser light source.

In the above described aspect of the presently disclosed subject matter, a thickness of the diffusion layer can be set so that the diffusion light emitted from the second surface has a generally uniform luminance distribution.

With this configuration, luminance variations can be improved. This effect results from the fact that the light from the semiconductor light emitting element condensed by the optical system (for example, condenser lens) is not incident on the wavelength conversion layer as local light. Instead, the light can be diffused by the diffusion layer and incident on the wavelength layer as the diffusion light having a generally uniform luminance distribution.

The optical system that can be configured to condense the light from the semiconductor light emitting element and locally irradiate the light-transmitting member with the light may be an optical system including a condenser lens that can condense the light from the semiconductor light emitting element and locally irradiate the light-transmitting member with the light. The optical system may be one including a condenser lens that condenses the light from the semiconductor light emitting element, and a light guide that can guide the light from the semiconductor light emitting element condensed by the condenser lens and locally irradiate the light-transmitting member with the light.

According to another aspect of the presently disclosed subject matter, a vehicle lamp can include the light emitting device according to any of the above subject matters; and an optical system that is configured to control light from the light emitting device to irradiate in front of a vehicle.

According to the aspect of the presently disclosed subject matter, there can be provided a light emitting device and a vehicle lamp utilizing the light emitting device that can prevent the bonding material, such as an adhesive, for bonding the light-transmitting member and the head portion from entering the through hole (through which the light emitted from the semiconductor light emitting element passes).

BRIEF DESCRIPTION OF DRAWINGS

These and other characteristics, features, and advantages of the presently disclosed subject matter will become clear from the following description with reference to the accompanying drawings, wherein:

FIG. 4A is an enlarged partial sectional view near a through hole, and FIGS. 4B, 4C, 4D, and 4E each are an enlarged partial sectional view near a through hole as a modification;

FIGS. 6A to 6C show the luminance distributions of diffusion light emitted from upper surfaces of three diffusion layers having respective different thicknesses when lower surfaces of the respective diffusion layers are locally irradiated (in a spot-like manner) with laser light condensed by a condenser lens;

FIG. 9 is a longitudinal sectional view of the light emitting device (modification);

DESCRIPTION OF EXEMPLARY EMBODIMENTS

A description will now be made below to vehicle lamps of the presently disclosed subject matter with reference to the accompanying drawings in accordance with exemplary embodiments.

Figure 1:
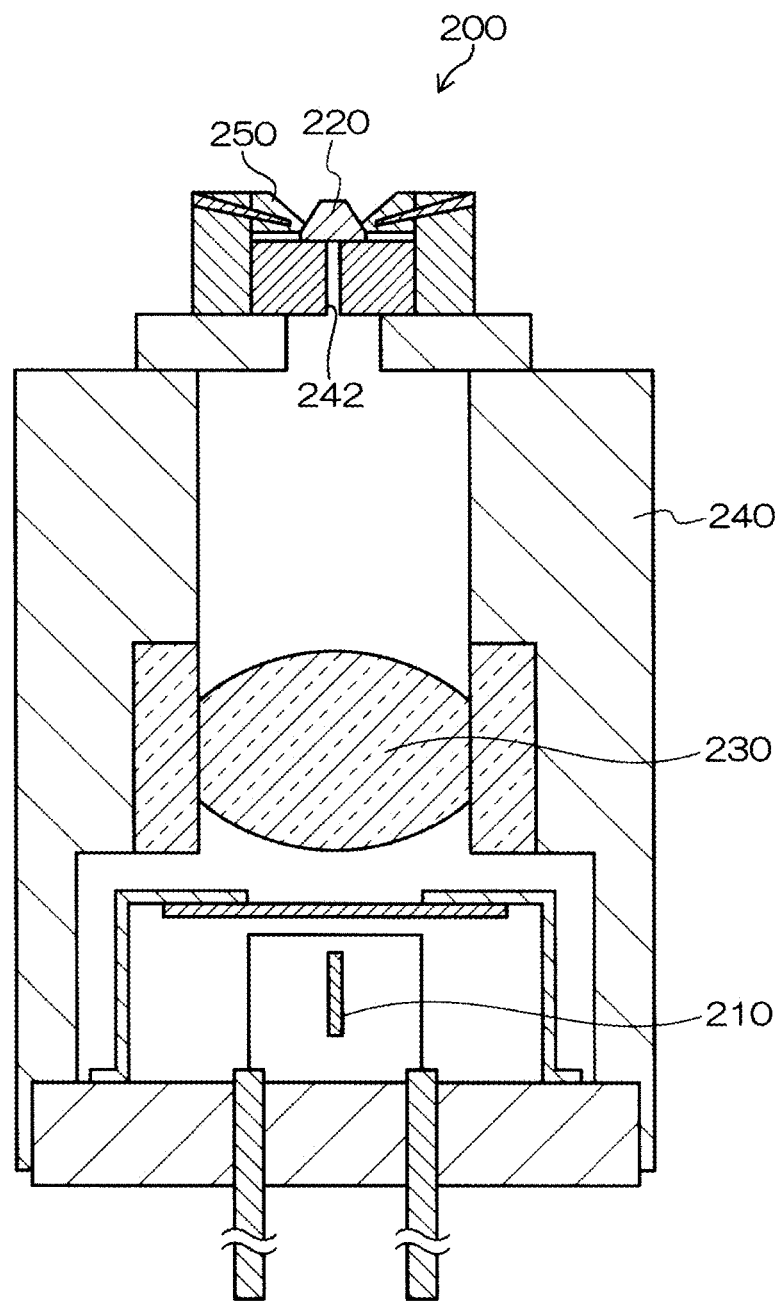
FIG. 1 is a sectional view of a conventional light emitting device.
Figure 2:
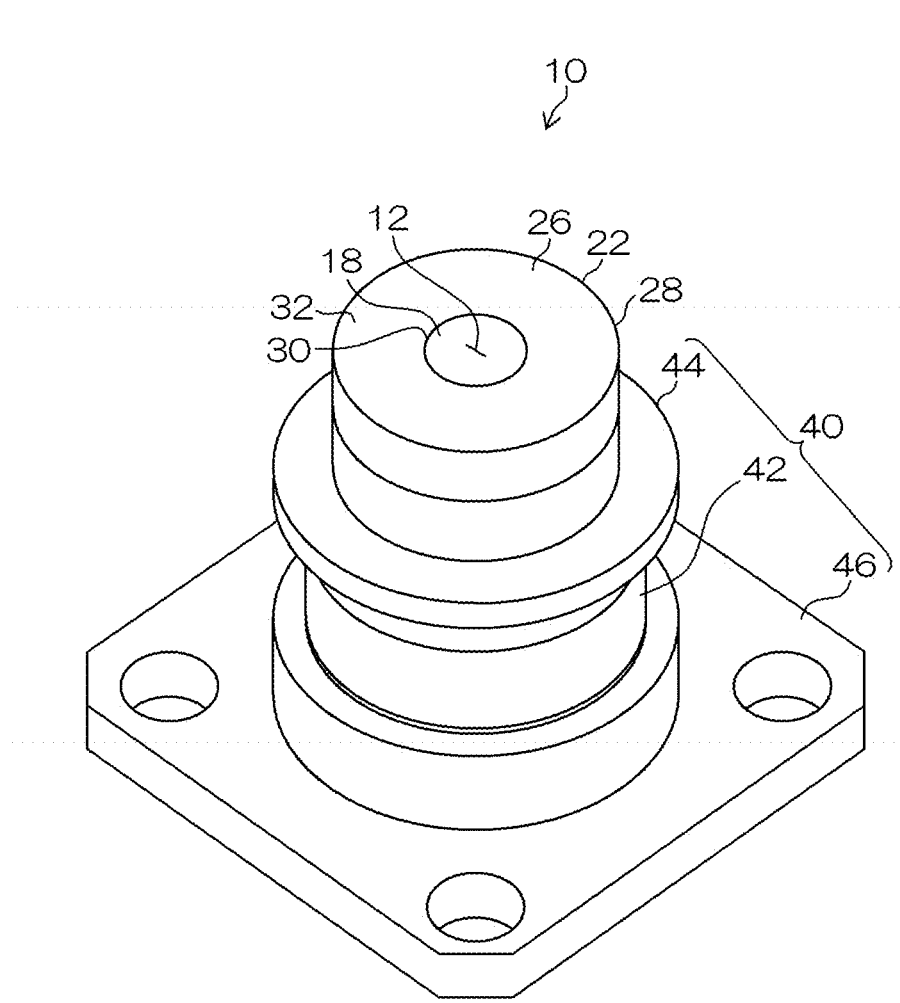
FIG. 2 is a perspective view of a light emitting device which is an embodiment made in accordance with principles of the presently disclosed subject matter.
Figure 3:
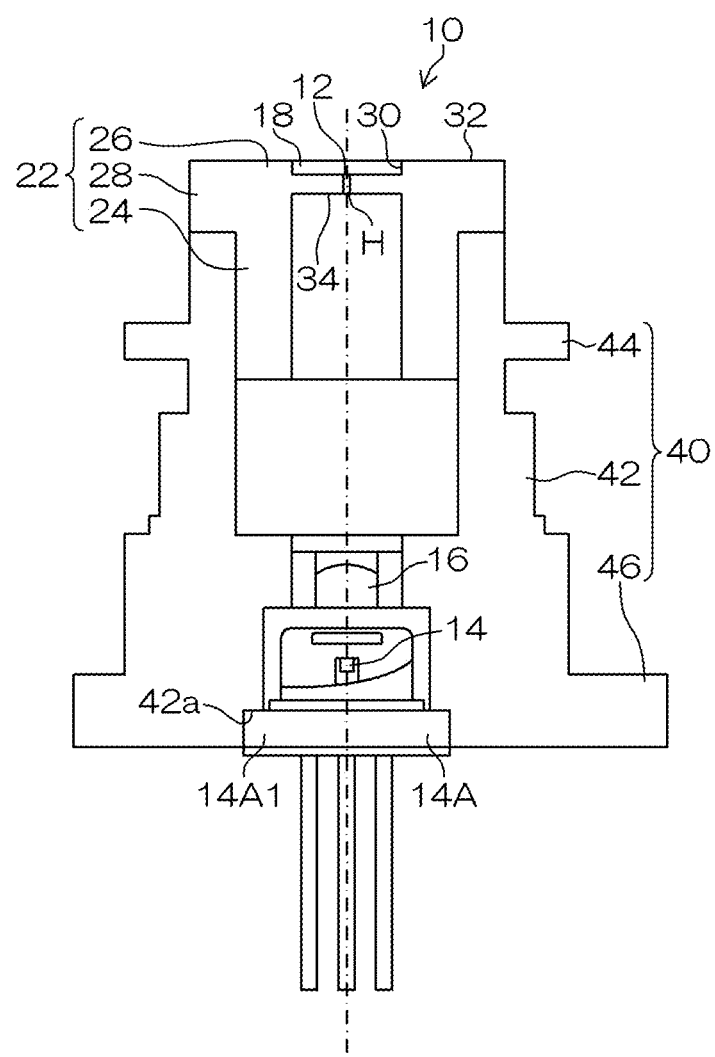
FIG. 3 is a longitudinal sectional view of the light emitting device.

FIG. 2 is a perspective view of a light emitting device which is an embodiment made in accordance with principles of the presently disclosed subject matter. FIG. 3 is a longitudinal sectional view of the same. FIG. 4A is an enlarged partial sectional view near a through hole, and FIGS. 4B, 4C, 4D, and 4E each are an enlarged partial sectional view near a through hole as a modification.

As shown in FIGS. 2 to 4E, the light emitting device 10 can include a light-transmitting member 12, a semiconductor light emitting element 14, a condenser lens 16, a high reflectance member 18, a bonding material (adhesive) 20, and holders for holding such components, composed of a first holder 22 and a second holder 40.

The first holder 22 can be made of metal such as stainless steel. As shown in FIG. 3, the first holder 22 can include a cylindrical tube portion 24, a head unit 26 blocking an upper open end of the tube portion 24, and a flange portion 28 arranged around an upper part of the tube portion 24. The first holder 22 can be a separate member from the second holder 40 (for example, refer to FIG. 3) or an integrally formed member with the second holder 40 (not shown). When the latter configuration is adopted, heat dissipation due to the light for use in local irradiation from the semiconductor light emitting element 14 (for example, semiconductor laser light source) can be enhanced. This advantage results from the fact that any gap between the first holder 22 and the second holder 40 is not present, and as a result, the contact heat resistance due to the gap therebetween can be prevented from occurring.

As shown in FIG. 4A, the head portion 26 can be configured to include a surface (the front surface) 32, a back surface 34 opposite thereto, and a through hole H. The surface 32 can include a head-unit-side recess 30 (corresponding to the second recess in the presently disclosed subject matter) having a bottom surface 30a where a convex 70 is formed. The through hole H penetrates the tip surface 70a of the convex portion 70 and the back surface 34.

The through hole H can have a constant diameter through the entire length as shown in FIGS. 4A, 4B, and 4E. Alternatively, the through hole H can have a diameter (size) increasing from the front surface 32 side of the head portion 26 (on the side of the bottom surface 30a of the head-portion-side recess 30) to the back surface 34 side of the head portion 26, as shown in FIGS. 4C and 4D. If the latter configuration is adopted, the following advantages can be provided.

Firstly, the light incident efficiency of light for use in local irradiation from the semiconductor light emitting element 14 to be incident on the back surface of the light-transmitting member 12 (the bottom surface 72a of the diffusion-layer-side recess 72) can be enhanced. This advantage results from the fact that the through hole H is configured to increase in size from the front surface 32 side of the head portion 26 to the back surface 34 side of the head portion 26, it is possible to prevent part of light passing through the through hole H from the semiconductor light emitting element 14 from being shielded by the inner wall of the through hole H.

Secondly, even if the optical axis of the semiconductor light emitting element 14 is offset from a desired center, the light from the semiconductor light emitting element 14 can pass through the through hole H without being shielded, thereby improving the yield in an optical axis adjustment process.

As shown in FIG. 4A, the light-transmitting member 12 can be a wavelength conversion member including a diffusion layer 36 (or may be referred to as a diffusion plate) and a wavelength conversion layer 38. Note that the diffusion layer 36 may be omitted, so that the entire light-transmitting member 12 can be composed of the wavelength conversion layer 38.

The diffusion layer 36 can be a layer that can include a lower surface 36a (corresponding to the first surface of the presently disclosed subject matter) including a recess 72 on the diffusion layer side (corresponding to the first recess of the presently disclosed subject matter), to which the convex portion 70 is fitted, and a lower surface 36b on the opposite side thereto (corresponding to the second surface of the presently disclosed subject matter). The diffusion layer 36 can diffuse the light from the semiconductor light emitting element 14 with which the lower surface 36a (the bottom surface 72a of the diffusion-layer-side recess 72) is irradiated locally (or in a spot light-like manner), so as to emit the resultant as diffusion light from the upper surface 36b.

The relationship between the height of the convex portion 70 and the depth of the diffusion-layer-side recess 72 can be configured such that the depth of the diffusion-layer-side recess 72 is equal to or larger than the height of the convex portion 70.

The diffusion layer 36 can be an article prepared by molding alumina with a die while controlling the transmittance by grain boundary control, or by molding with a die a low-melting point glass in which light scattering particles (made of, for example, silica, alumina, titania, or the like are dispersed. For example, the diffusion layer 36 can be a layer of rectangular plate shape (for example, a rectangle of 0.4 mm×0.8 mm with a thickness of 300 μm to 400 μm), made of a composite body (for example, sintered body) of YAG (for example, 25%) and alumina $Al_2O_3$ (for example, 75%). The YAG is not doped with an activator (also referred to as luminescent center) such as cerium (Ce).

The light-transmitting member 12 (the lower surface 36a of the diffusion layer 36) and the surface 32 (the bottom surface 30a of the recess 30 on the head portion side) of the head portion 26 can be bonded with a bonding material 20, for example, an adhesive.

The adhesive 20 can bond part of the surface 32 of the head portion 26 (the bottom surface 30a of the head-portion-side recess 30) around the convex portion 70 to the lower surface 36a of the diffusion layer 36 while the convex portion 70 is fitted to the diffusion-layer-side recess 72 and the bottom surface 72a of the diffusion-layer-side recess 72 covers the through hole H. Part of the lower surface 36a of the diffusion layer 36 (the bottom surface 72a of the diffusion-layer-side recess 72) can be exposed from the through hole H.

Here, the bonding material 20 can be an adhesive including an organic adhesive, inorganic adhesive, or the like. Examples of the bonding material 20 may include metals with high heat conductivity, such as silver, copper, aluminum, or the like, resin-based adhesives (such as epoxy-based, acrylic-based, silicone-based, and urethane-based resins) in which ceramic with high heat conductivity (such as alumina, aluminum nitride, silicon carbide, graphite, and the like) is added as a filler.

The diffusion layer 36 may be any layer that diffuses the light (in the present embodiment, laser light) from the semiconductor light emitting element 14 with which the lower surface 36a (the bottom surface 72a of the diffusion-layer-side recess 72) is locally irradiated (or in a spot-light manner), and emits the resultant as diffusion light from the upper surface 36b (corresponding to the second surface of the presently disclosed subject matter). The shape of the diffusion layer 36 is not limited to the foregoing.

Figure 5A:
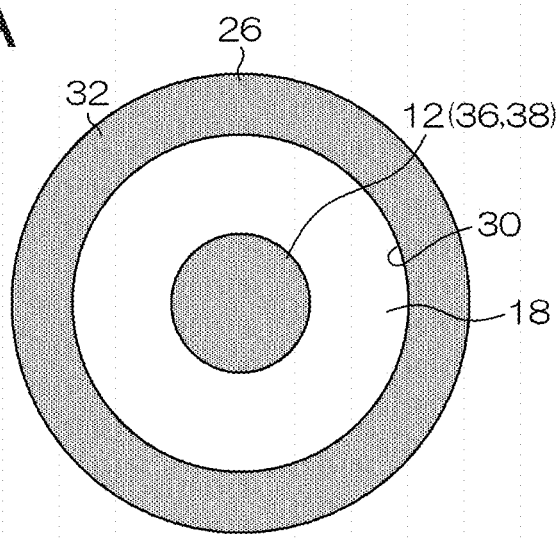
FIG. 5A is a top view of the light emitting device.
Figure 5B:
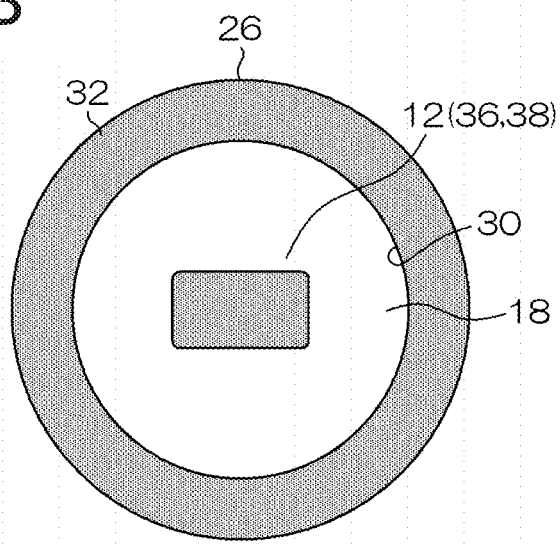
FIG. 5B is a top view of the light emitting device (modification)

For example, the diffusion layer 36 may be a cylindrical columnar layer (for example, ϕ0.4 mm to 0.8 mm), as shown in FIG. 5A. The diffusion layer 36 may be a rectangular solid layer (for example, 0.3 mm to 0.6 mm across and 0.6 mm to 2.0 mm long), as shown in FIG. 5B. Layers of other shapes may be used. FIG. 5A is a top view of the light emitting device 10, and FIG. 5B is a top view of the light emitting device 10 (modification).

The diffusion layer 36 may be any layer that diffuses the light (in the present embodiment, laser light) from the semiconductor light emitting element 14 with which the lower surface 36a (the bottom surface 72a of the diffusion-layer-side recess 72) is locally irradiated (or in a spot-light manner), and emits the resultant as diffusion light from the upper surface 36b (corresponding to the second surface of the presently disclosed subject matter). The material of the diffusion layer 36 is not limited to the foregoing.

For example, the diffusion layer 36 may be a layer of a composite body of YAG and glass. The diffusion layer 36 may be a layer of bubble-dispersed alumina $Al_2O_3$ (or glass). Layers of other materials may be used.

The diffusion layer 36 can have the thickness of 300 μm to 400 μm from the following point of view.

The inventor of the present application has confirmed that the thickness h (see FIG. 4A) of the diffusion layer 36 can be increased to improve luminance variations of the diffusion light emitted from the upper surface 36b of the diffusion layer 36 for uniform (or generally uniform) luminance distribution.

FIGS. 6A to 6C show the luminance distributions of the diffusion light emitted from the upper surfaces 36b of three diffusion layers 36 having respective different thicknesses h when the lower surface 36a (center) of each diffusion layer 36 was locally irradiated (in a spot-like manner) with laser light condensed by the condenser lens 16. The diffusion layers 36 were made of a composite body of YAG (25%), not doped with cerium (Ce) or other activators, and alumina $Al_2O_3$ (75%). The diffusion layer 36 was formed to have a rectangular plate shape with a size of 0.4 mm×0.8 mm. The laser light from the semiconductor light emitting element 14 condensed by the condenser lens 16 was adjusted to an elliptical spot size of approximately 100 μm long and approximately 20 μm to 30 μm across. The side surfaces of the diffusion layers 36 were covered with a high reflectance member, for example, a white resin.

Referring to FIGS. 6A to 6C, it can be seen that luminance variations improve gradually as the thickness h of the diffusion layer 36 increases from 100 μm (see FIG. 6A) to 200 μm (see FIG. 6B) to 400 μm (see FIG. 6C). The luminance distribution becomes uniform (or generally uniform) at the thickness h=400 μm. The reason is that as the thickness h of the diffusion layer 36 increases, the number of times of scattering (the number of times of scattering due to a difference in refractive index between YAG and alumina $Al_2O_3$) of the laser light condensed by the condenser lens 16 (and luminescence caused by the laser light) in the diffusion layer 36 increases to uniformize the laser light. Such uniformized laser light (and luminescence caused by the laser light) is emitted from the upper surface 36b of the diffusion layer 36.

From the foregoing, it is shown that the thickness h of the diffusion layer 36 can be increased to improve luminance variations of the diffusion light emitted from the upper surface 36b of the diffusion layer 36 and make the luminance distribution uniform (or generally uniform).

Based on the above finding, the thickness h of the diffusion layer 36 can be set to a thickness such that the diffusion light emitted from the upper surface 36b of the diffusion layer 36 has a uniform (or generally uniform) luminance distribution. Accordingly, in the present embodiment, h falls within the range of 300 μm to 400 μm. Note that the thickness h of the diffusion layer 36 is not limited to 300 μm to 400 μm and may have other values as long as the diffusion effect is obtained.

The diffusion layer 36 having the above configuration can suppress a drop in efficiency due to luminance saturation and temperature quenching. The reason is that the light from the semiconductor light emitting element 14 (in the present embodiment, laser light) condensed by the condenser lens 16 is not incident on the wavelength conversion layer 38 (lower surface 38a) as local light. Instead, the light is diffused by the diffusion layer 36 and incident on the wavelength conversion layer 38 (lower surface 38a) as diffusion light having a generally uniform luminance distribution.

As shown in FIG. 4A, the wavelength conversion layer 38 can be a layer including the lower surface 38a (corresponding to the third surface according to the presently disclosed subject matter) joined to the upper surface 36b of the diffusion layer 36 and an upper surface 38b (corresponding to the fourth surface according to the presently disclosed subject matter) on the opposite side. The wavelength conversion layer 38 can convert the wavelength of the diffusion light from the diffusion layer 36 incident on the lower surface 38a, and can emit the resultant from the upper surface 38b.

The wavelength conversion layer 38 can be an article in which phosphor is dispersed in an inorganic binder, or a phosphor ceramics plate. For example, the wavelength conversion layer 38 can be a layer with a rectangular plate shape (for example, a rectangle of 0.4 mm×0.8 mm with a thickness of 80 μm), made of a composite body (for example, sintered body) of activator-doped YAG and alumina $Al_2O_3$. Examples of the activator include cerium (Ce).

The diffusion layer 36 and the wavelength conversion layer 38 can be fixed (joined) so that the upper surface 36b of the diffusion layer 36 and the lower surface 38a of the wavelength conversion layer 38 are in surface contact with each other.

For example, if the wavelength conversion layer 38 is an article in which phosphor is dispersed in an inorganic binder, the diffusion layer 36 (the upper surface 36b) and the wavelength conversion layer 38 (the lower surface 38a) can be fixed (joined) by printing a material in which phosphor is dispersed in the inorganic binder to the upper surface 36b of the diffusion layer 36 with each other and/or baking it. If the wavelength conversion layer 38 is a phosphor ceramics plate, the plate can be fixed (joined) to the diffusion layer 36 (the upper surface 36b) and the wavelength conversion layer 38 (the lower surface 38a) by thermal pressure bonding.

If the diffusion layer 36 and the wavelength conversion layer 38 are both made of ceramics, the diffusion layer 36 (the upper surface 36b) and the wavelength conversion layer 38 (the lower surface 38a) can be fixed (joined) by high-temperature curing the upper surface 36b of the diffusion layer 36 and the lower surface 38a of the wavelength conversion layer 38 in surface contact with each other.

If the wavelength conversion layer 38 is a glass phosphor layer, the diffusion layer 36 (the upper surface 36b) and the wavelength conversion layer 38 (the lower surface 38a) can be fixed (joined) by curing the upper surface 36b of the diffusion layer 36 and the lower surface 38a of the wavelength conversion layer 38 in surface contact with each other.

The wavelength conversion layer 38 may be any layer that can convert the wavelength of the diffusion light from the diffusion layer 36 incident on the lower surface 38a and can emit the resultant from the upper surface 38b. The shape of the wavelength conversion layer 38 is not limited to the foregoing.

For example, the wavelength conversion layer 38 may be a circular columnar layer (for example, φ0.4 mm to 0.8 mm) as shown in FIG. 5A. The wavelength conversion layer 38 may be a rectangular solid layer (for example, 0.3 mm to 0.6 mm across and 0.6 mm to 2.0 mm long) as shown in FIG. 5B. Layers of other shapes may be used.

The shape of the upper surface of the wavelength conversion layer 38 can be appropriately selected from various shapes including a circle, an oval, a square, and the like in accordance with the adopted optical system. For the application in vehicle headlights, the upper surface shape of the wavelength conversion layer 38 can be a rectangle. The position and diameter of the through hole H formed therein can be appropriately adjusted in accordance with the desired luminance distribution.

The wavelength conversion layer 38 may be any layer that can convert the wavelength of the diffusion light from the diffusion layer 36 incident on the lower surface 38a and can emit the resultant from the upper surface 38b. The material of the wavelength conversion layer 38 is not limited to the foregoing.

For example, the wavelength conversion layer 38 may be a layer of a composite body of activator-doped YAG and a glass binder. Examples of the activator include cerium (Ce). Layers of other materials may be used.

As shown in FIG. 4A, the high reflectance member 18 can be a high reflectance member such as a white resin (a resin in which alumina or titania is dispersed in a high density), which is arranged in a space surrounded by the head-portion-side recess 30 (the bottom surface 30a and the inner wall 30b), and the light-transmitting member 12 (the side surface 12a). For example, the high reflectance member 18 can be filled into the space by a dispenser until the high reflectance member 18 becomes flush with the top surface of the light-transmitting member 12 (the upper surface 38*b* of the wavelength conversion layer 38). The high reflectance member 18 can thus cover at least part of the side surfaces 12*a* of the light-transmitting member 12. This improves the light output efficiency. The reason is that since the side surfaces 12*a* of the light-transmitting member 12 are covered with the high reflectance member 18, light emitted from the side surfaces 12*a* of the light-transmitting member 12 is reflected from the high reflectance member 18 to enter the light-transmitting member 12 again. As a result, the light output efficiency improves as compared to when the side surfaces 12*a* of the light-transmitting member 12 are not covered with the high reflectance member 18. If the light output efficiency need not be improved, the high reflectance member 18 may be omitted.

The high reflectance member 18 can be held in the space so as to be less likely to fall off. The reason is that the high reflectance member 18 is in close contact with the inner wall 30*b* and the bottom surface 30*a* of the head-portion-side recess 30 and the side surfaces 12*a* of the light-transmitting member 12.

Figure 7A:
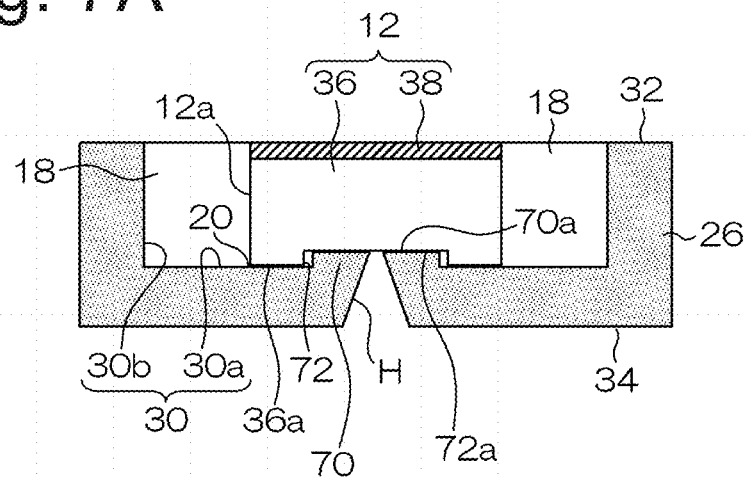
FIGS. 7A and 7B each are an enlarged partial sectional view near a through hole (modification)
Figure 7B:
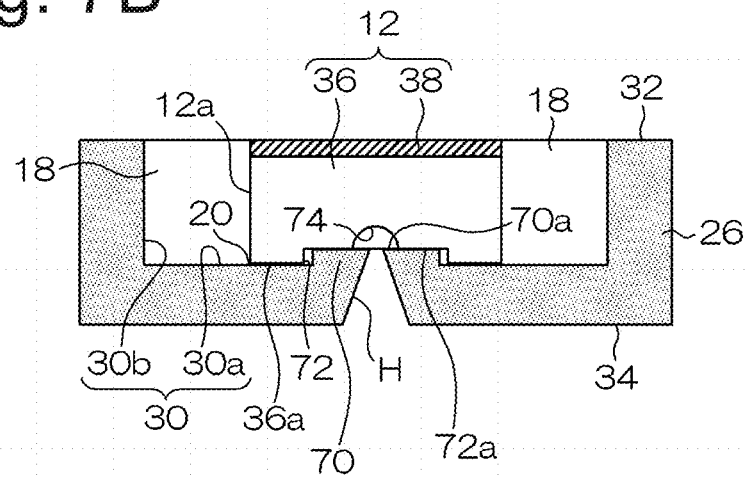

FIGS. 7A and 7B each are an enlarged partial sectional view near a through hole (modification).

The side surface 12*a* (at least side surface of the diffusion layer 36) may be inclined from the lower surface 36*a* side of the diffusion layer 36 to the upper surface 36*b* side of the diffusion layer 36 as shown in FIGS. 4A to 4E. The presently disclosed subject matter is not limited thereto. As shown in FIGS. 7A and 7B, the side surface 12*a* may be a vertical surface without being inclined. In the former case, even when the adhesive 20 or the like deteriorates, the light-transmitting member 12 can be prevented from peeling and falling off. This advantage results from the fact that the inwardly inclined side surface 12*a* of the light-transmitting member 12 (at least side surface of the diffusion layer 36) is covered with the high reflectance member 18 so as to function as a falling-off prevention means of the light-transmitting member 12.

In the latter case, the diffusion layer 36 having a vertical side surface can be produced by cutting a raw material such as a diffusion plate with a dicing machine to a desired shape with less cost. Furthermore, in the latter case, the diffusion light can be efficiently guided to the wavelength conversion layer 38 with a pass having a constant cross-sectional area.

As shown in FIGS. 4B, 4D, and 7B, the bottom surface of the light-transmitting member 12 (the bottom surface 72*a* of the diffusion-layer-side recess 72) can have a recess 74 (corresponding to the third recess of the presently disclosed subject matter) in order to reflect (scatter or the like) the light emitted from the semiconductor light emitting element 14 and being incident thereon in directions other than the direction in which the light is incident thereon.

In this case, the recess 74 may be a spherical recess having a diameter larger than the outer diameter of the through hole H.

With this configuration, the following advantage can be obtained when compared with the case where the bottom surface of the light-transmitting member 12 (the bottom surface 72*a* of the diffusion-layer-side recess 72) is flat (for example the case shown in FIG. 4A).

Firstly, the light incident efficiency of light (in the present embodiment, laser light) for use in local irradiation from the semiconductor light emitting element 14 to be incident on the lower surface 36*a* of the diffusion layer 36 (the bottom surface 72*a* of the diffusion-layer-side recess 72) can be enhanced. This advantage results from the fact that the light (in the present embodiment, laser light) for use in local irradiation from the semiconductor light emitting element 14 can be diffused by the recess 74.

Secondly, the bonding material such as an adhesive 20 can be prevented from adhering to the portion of the bottom surface 72*a* of the diffusion-layer-side recess 72 where the light for use in local irradiation from the semiconductor light emitting element 14 can be incident. This advantage results from the fact that even when the adhesive 20 enters the tip surface 70*a* of the convex portion 70 through a gap S (see FIG. 4A) between the convex portion 70 (the side surface) and the diffusion layer 36 (the side surface), the entering adhesive 20 cannot go up to the diffusion-layer-side recess 72.

Thirdly, the light reflected from the diffusion-layer-side recess 72 (the light component of the first excitation light being reflected from the diffusion-layer-side recess 72 and returned to the back surface) can be prevented from passing through the through hole H and returning to the semiconductor light emitting element 14 or area therearound. Note that the recess 74 can have a surface shape for reflecting (scattering or the like) the light emitted from the semiconductor light emitting element 14 and being incident thereon in directions other than the direction in which the light is incident thereon (a light-scattering surface or the like). Thus, the shape is not limited to particular shapes.

For example, the recess 74 can be a cylindrical, triangle prismatic, quadrangular prismatic or polygonal prismatic recess. Furthermore, the recess 74 can be a conical, triangular pyramidal, quadrangular pyramidal or polygonal pyramidal recess. The shape there of is any other shape for recesses.

FIG. 4E shows an example of a through hole H as another modification. In this configuration, the head portion 26 is made of a metal with high processability, such as aluminum or copper, and part of the surface 32 of the head portion 26 (bottom surface 30*a* of the head-portion-side recess 30) around the diffusion layer 36 is cut using a carbide turning tool or the like and is subjected to build-up with a material (at least at two locations). Part 76 of the head portion 26 having been build-up is brought into contact with the lower part of the side surface 12*a* of the light-transmitting member 12 (at least the side surface of the diffusion layer 36), thereby fixing the entire light-transmitting member 12.

The part 76 of the head portion 26 having been build-up (corresponding to the fixing unit of the presently disclosed subject matter) can be arranged to surround the side surface 12*a* of the light-transmitting member 12 (at least at two locations) and can fix the light-transmitting member 12 while being fitted to the side surface 12*a* of the light-transmitting member 12 (at least the side surface of the diffusion layer 36). With this configuration, the light-transmitting member 12 can be strongly fixed, thereby configuring the head portion 26 with high reliability against heat shock and vibration. Further, even if the adhesive 20 deteriorates, the light-transmitting member 12 can be prevented from peeling and falling off.

Part of the head portion 26 (corresponding to the fixing unit of the presently disclosed subject matter) can be build-up by spot-welding using a YAG laser processing or the like part of the surface 32 of the head portion 26 (the bottom surface 30*a* of the head-portion-side recess 30) around the diffusion layer 36 so that the part of the head portion 26 is brought into close contact with the lower portion of the side surface 12*a* of the light-transmitting member 12 (at least the side surface of the diffusion layer 36), thereby fixing the entire light-transmitting member 12.

The light-transmitting member 12 can be fixed with a separate member (not shown) independent of the head portion 26.

The head portion 26 as shown in FIG. 4E can be produced, for example, by the following procedure.

FIG. 8A to 8E show an example of the production process of the head portion 26 illustrating in FIG. 4E.

Figure 8A:
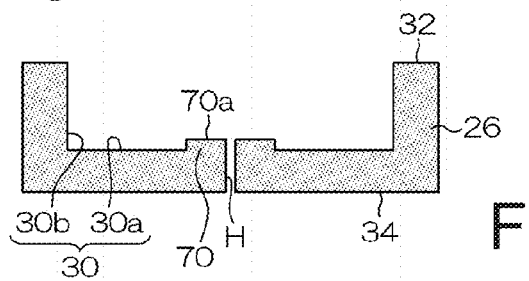
FIG. 8A to 8E show an example of the production process of the head portion illustrating in FIG. 4E.

As shown in FIG. 8A, a head portion 26 is prepared. The head portion 26 has been processed in advance by a die or cutting tool to include a front surface 32 including a head-portion-side recess 30 (including a bottom 30a with a convex portion 20 formed therein), a back surface 34 opposite thereto, and a through hole H penetrating the tip surface 70 of the convex portion 70 and the back surface 34.

Figure 8B:
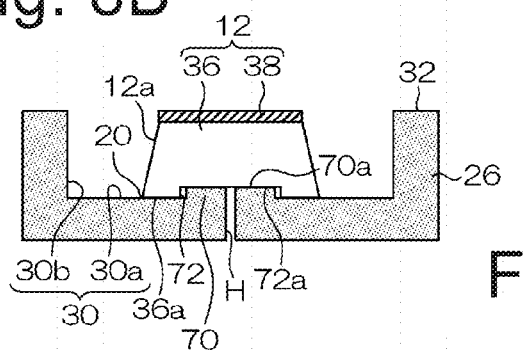

Next, as shown in FIG. 8B, a predetermined amount of an adhesive 20 is applied to the lower surface 36a of the diffusion layer 36 and/or the surface 32 of the head portion 26 (the bottom surface 30a of the head-portion-side recess 30) around the convex portion 70. Then, the convex portion 70 is caused to be fit to the diffusion-layer-side recess 72 to press the light-transmitting member 12 against the head portion 26. After that, the adhesive is cured by heat for bonding.

Figure 8C:
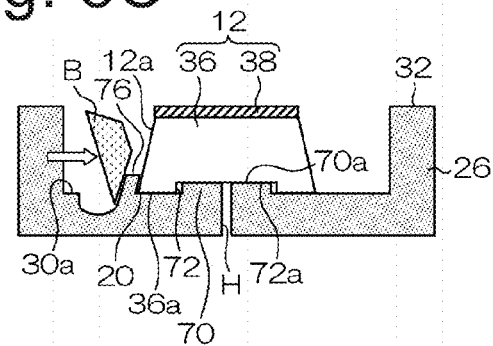
Figure 8D:
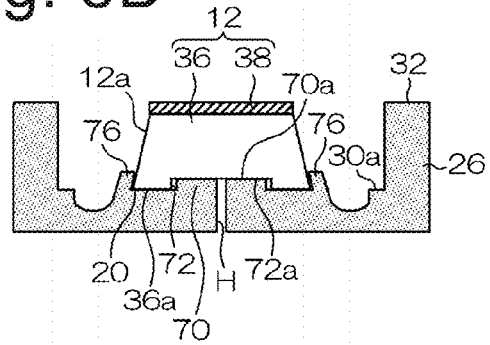

Next, as shown in FIGS. 8C and 8D, the part of the surface 32 of the head portion 26 (the bottom surface 30a of the head-portion-side recess 30) around the diffusion layer 36 is cut using a carbide turning tool B or the like while being build-up, so that part 76 of the build-up head portion 26 (at least at two locations) is brought into close contact with the lower portion of the side surface 12a of the light-transmitting member 12 (at least the side surface of the diffusion layer 36), thereby fixing the entire light-transmitting member 12.

Figure 8E:
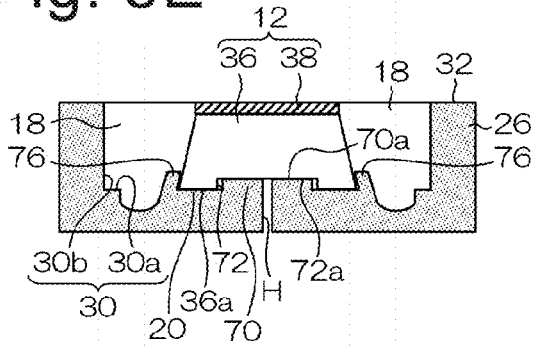

Lastly, as shown in FIG. 8E, a high reflectance member 18 is filled within a space surrounded by the head-portion-side recess 30 (the inner wall 30b and bottom surface 30a) and the light-transmitting member 12 (the side surface 12a) so that the high reflectance member becomes flush with the top surface of the light-transmitting member 12 (the upper surface 38b of the wavelength conversion layer 38).

As described, the head portion 26 shown in FIG. 4E can be produced.

The second holder 40 can be made of metal such as stainless steel. A shown in FIG. 3, the second holder 40 can include a cylindrical tube portion 42, an upper flange portion 44 provided around an upper part of the tube portion 42, and a lower flange portion 46 arranged around a lower part of the tube portion 42.

The first holder 22 can be fixed to the second holder 40 so that the tube portion 24 is inserted into the tube portion 42 of the second holder 40 through a top opening of the tube portion 42, with the flange portion 28 of the first holder 22 and the top end of the tube portion 42 of the second holder 40 in contact with each other.

The semiconductor light emitting element 14 can be a semiconductor light emitting element that emits light to pass through the through hole H and for the light-transmitting member 12 (the bottom surface 72a of the diffusion-layer-side recess 72) to be irradiated with. Examples of the semiconductor light emitting element 14 may include a semiconductor laser light source such as a laser diode (LD) having a blue emission wavelength (around 450 nm). In the present embodiment, as shown in FIG. 3, the semiconductor light emitting element 14 can be packaged to constitute a can-type semiconductor laser light source 14A.

The semiconductor light emitting element 14 is not limited to a laser diode, and may be a light-emitting diode (LED). The emission wavelength of the semiconductor light emitting element 14 is not limited to the blue region (around 450 nm). For example, a near ultraviolet region (around 405 nm) may be used. If the semiconductor light emitting element 14 has an emission wavelength in the near ultraviolet region (around 405 nm), the wavelength conversion layer 38 can use three color phosphors in blue, green, and red, or two color phosphors in blue and yellow.

The semiconductor laser light source 14A can be inserted into the tube portion 42 of the second holder 40 through a bottom opening of the tube portion 42. The semiconductor laser light source 14A can be fixed to the second holder 40 so that a flange portion 14A1 of the semiconductor laser light source 14A and a step portion 42a of the tube portion 42 are in contact with each other.

The condenser lens 16 can be an optical system that can condense the light from the semiconductor light emitting element 14 and can locally irradiate the light-transmitting member 12 (the lower surface 36a of the diffusion layer 36) with the light. The condenser lens 16 can be held by the second holder 40 and arranged between the light-transmitting member 12 and the semiconductor light emitting element 14.

In the light emitting device 10 having the above configuration, the light from the semiconductor light emitting element 14 can be condensed by the condenser lens 16 and can pass through the through hole H. The light-transmitting member 12 (the bottom surface 72a of the diffusion-layer-side recess 72) located at a distance from the semiconductor light emitting element 14 can be locally irradiated (in a spot-like manner) with the light. The spot size can be adjusted, for example, to an elliptical shape of approximately 100 μm long and approximately 20 μm to 30 μm across. The light with which the light-transmitting member 12 (the bottom surface 72a of the diffusion-layer-side recess 72) is locally irradiated (in a spot-like manner) can be diffused inside the diffusion layer 36 and emitted from the upper surface 36b of the diffusion layer 36 as diffusion light having a uniform (or generally uniform) luminance distribution. The diffusion light can be incident on the lower surface 38a of the wavelength conversion layer 38.

The wavelength conversion layer 38 on which the diffusion light from the diffusion layer 36 is incident can emit white light. The white light can be obtained by color mixture of the transmitted diffusion light from the diffusion layer 36 and light (luminescence) that is emitted due to excitation by the diffusion light from the diffusion layer 36.

As has been described above, the light emitting device 10 according to the present embodiment can provide the following advantages.

Firstly, the light emitting device 10 can prevent the bonding material such as an adhesive 20 for bonding the light-transmitting member 12 (the lower surface 36a of the diffusion layer 36) and the head portion 26 (the front surface 32) from entering the through hole H (through which the light emitted from the semiconductor light emitting element 14 passes). This advantage results from the fact that the head portion 26 includes the convex portion 70 and the light-transmitting member 12 includes the diffusion-layer-side recess 72 to be fitted to the convex portion 70.

When the adhesive 20 is applied to the light-transmitting member 12 (the lower surface 36a of the diffusion layer 36) and/or the head portion 26 (the front surface 32) and the light-transmitting member 12 is urged against the head portion 26 for bonding, the adhesive 20 with fluidity may be spread therebetween to reach the through hole H. However, since the head portion 26 includes the convex portion 70 and the light-transmitting member 12 includes the diffusion-layer-side recess 72 to be fitted to the convex portion 70, this can prevent the adhesive 20 from creeping up. As a result, the adhesive 20 can be prevented from reaching the through hole H and entering the through hole H (through which the light emitted from the semiconductor light emitting element 14 passes).

Secondly, the positioning of the light-transmitting member 12 to the head portion 26 can be facilitated. This advantage results from the fact that convex portion 70 of the head portion 26 and the diffusion-layer-side recess 72 of the light-transmitting member 12 together function as a positioning means.

Thirdly, a heat dissipation pathway can be ensured for the heat generated due to the light for use in local irradiation from the semiconductor light emitting element 14 (for example, semiconductor laser light source). This advantage results from the fact that the adhesive 20 bonding the light-transmitting member 12 (the lower surface 36a of the diffusion layer 36) and the head portion 26 (the front surface 32) can enhance the adhesion between the light-transmitting member 12 (the lower surface 36a of the diffusion layer 36) and the head portion 26 (the front surface 32) and the contact heat resistance due to the gap therebetween can be reduced.

Fourthly, even when the adhesive 20 or the like deteriorates, the light-transmitting member 12 can be prevented from peeling and falling off. This advantage results from the fact that the convex portion 70 of the head portion 26 can be fit to the diffusion-layer-side recess 72 of the light-transmitting member 12.

Note that when the flatness of the front surface 32 of the head portion 26 and the lower surface 36a of the diffusion layer 36 is made uniform, the heat dissipation pathway can be ensured without the use of the adhesive 20 but only with the part 76 of the head portion 26 having been build-up (corresponding to the fixing unit of the presently disclosed subject matter).

Next, a modification will be described.

FIG. 9 is a longitudinal section view of a light emitting device 10 (modification).

In the foregoing embodiment, the condenser lens 16 (see FIG. 3) has been described as the optical system for condensing the light from the semiconductor light emitting element 14 and locally irradiating the light-transmitting member 12 (the lower surface 36a of the diffusion layer 36) with the light. The presently disclosed subject matter is not limited thereto.

For example, the condenser lens 16 serving as the optical system for condensing the light from the semiconductor light emitting element 14 and locally irradiating the light-transmitting member 12 (the lower surface 36a of the diffusion layer 36) with the light may be replaced with an optical system such as shown in FIG. 9. The optical system shown in FIG. 9 can include the condenser lens 16 and a light guide 48. The condenser lens 16 can condense the light from the semiconductor light emitting element 14. The light guide 48 can guide the light from the semiconductor light emitting element 14 condensed by the condenser lens 16 and can locally irradiate the light-transmitting member 12 (the lower surface 36a of the diffusion layer 36) with the light.

Examples of the light guide 48 may include an optical fiber having a center core (for example, with a core diameter of 0.2 mm) and a surrounding clad, neither of which is shown. The core has a refractive index higher than that of the clad. The laser light introduced into the light guide 48 through an end 48a of the light guide 48 (the laser light from the semiconductor light emitting element 14 condensed by the condenser lens 16) can be guided to the other end 48b of the light guide 48 as confined within the core by utilizing the total reflection at the interface between the core and the clad. The light can be emitted from the other end 48b, and the light-transmitting member 12 (the bottom surface 72a of the diffusion-layer-side recess 72) located at a distance from the semiconductor light emitting element 14 can be locally irradiated with the light.

The light with which the light-transmitting member 12 (the bottom surface 72a of the diffusion-layer-side recess 72) is locally irradiated (in a spot-like manner) can be diffused inside the diffusion layer 36 and emitted from the upper surface 36b of the diffusion layer 36 as diffusion light having a uniform (or generally uniform) luminance distribution. The diffusion light can be incident on the lower surface 38a of the wavelength conversion layer 38.

The wavelength conversion layer 38 on which the diffusion light from the diffusion layer 36 is incident can emit white light. The white light can be caused by color mixture of the transmitted diffusion light from the diffusion layer 36 and light that is emitted due to excitation by the diffusion light from the diffusion layer 36.

The light emitting device 10 of the present modification can provide the same effects as those of the foregoing embodiment.

Next, examples of a vehicle lamp (for example, vehicle headlight) using the light emitting device 10 having the above configuration will be described.

Figure 10:
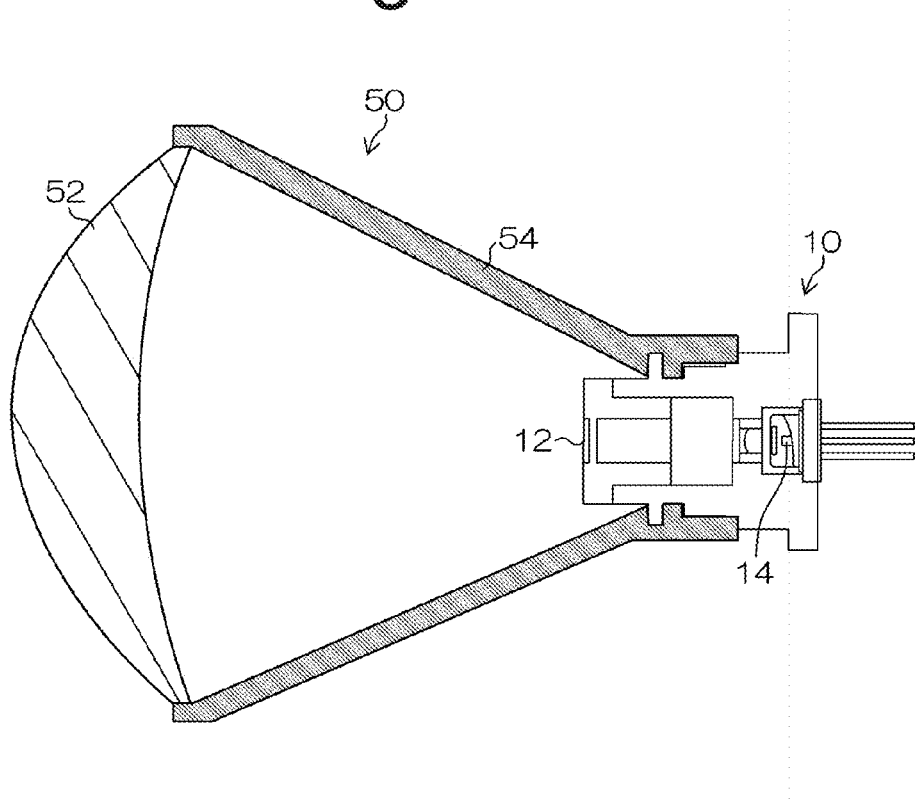
FIG. 10 is a diagram illustrating a configuration example of a vehicle lamp of so-called direct projection type (also referred to as direct emission type) which includes a projection lens as an optical system configured to control the light from the light emitting device to irradiate in front of a vehicle.

FIG. 10 shows an example of a vehicle lamp 50 of so-called direct projection type (also referred to as direct emission type). The vehicle lamp 50 can employ a projection lens 52 as an optical system configured to control the light from the light emitting device 10 and irradiate in front of the vehicle. The projection lens 52 and the light emitting device 10 arranged behind the projection lens 52 can be held in a predetermined positional relationship by a holder 54.

Figure 11:
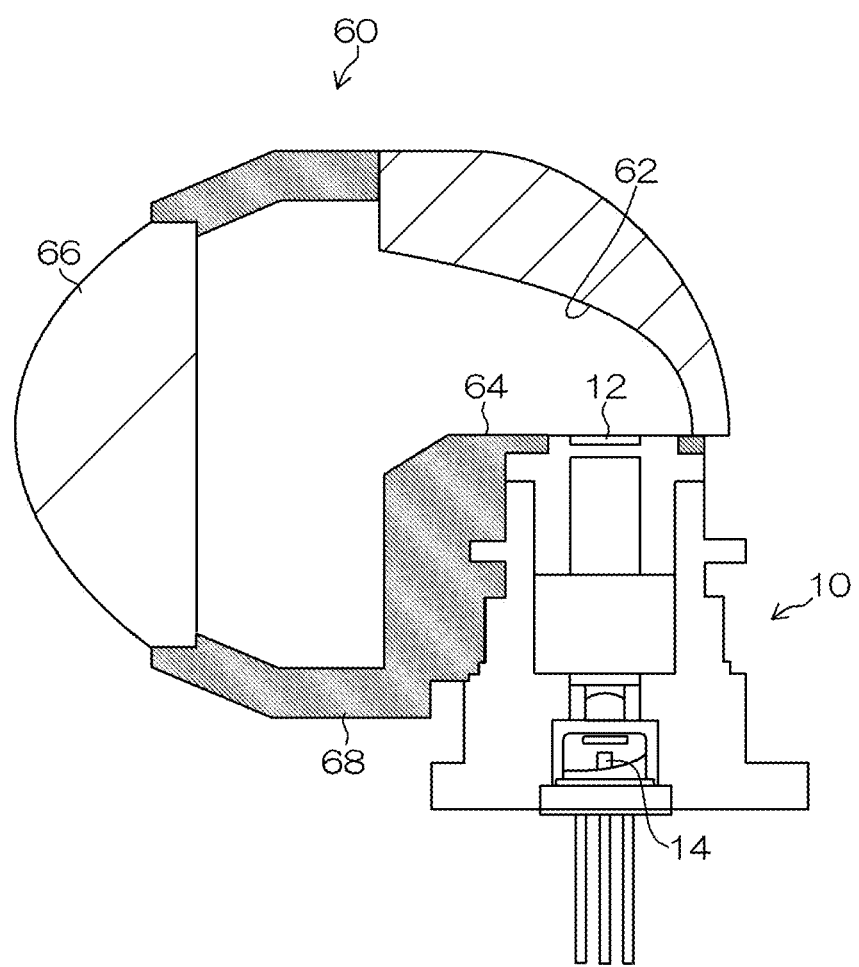
FIG. 11 is a diagram illustrating a configuration example of a vehicle lamp of so-called projector type which includes a reflection surface, a shade, and a projection lens as the optical system configured to control the light from the light emitting device to irradiate in front of a vehicle.

FIG. 11 shows an example of a vehicle lamp 60 of so-called projector type. The vehicle lamp 60 can include a reflection surface 62, a shade 64, and a projection lens 66 as the optical system configured to control the light from the light emitting device 10 and irradiate in front of the vehicle. The reflection surface 62, the shade 64, the projection lens 66, and the light emitting device 10 can be held in a predetermined positional relationship by a holder 68.

Aside from vehicle lamps such as vehicle headlights, the light emitting device 10 may be used, for example, as a projection light, indoor lighting, outdoor lighting, a projector light source, and light sources for use in various LD illumination products.

It will be apparent to those skilled in the art that various modifications and variations can be made in the presently disclosed subject matter without departing from the spirit or scope of the presently disclosed subject matter. Thus, it is intended that the presently disclosed subject matter cover the modifications and variations of the presently disclosed subject matter provided they come within the scope of the appended claims and their equivalents. All related art references described above are hereby incorporated in their entirety by reference.

What is claimed is:

1. A light emitting device comprising:
   a head portion including a surface including a convex portion having a tip surface, a back surface opposite to the surface, and a through hole penetrating the tip surface of the convex portion and the back surface;
   a light-transmitting member including a front surface and a rear surface opposite the front surface, the rear surface including a first recess to be fitted to the convex portion, the first recess having a bottom surface;
   a bonding material that bonds part of the surface of the head portion around the convex portion to the rear surface of the light-transmitting member while the convex portion is fitted to the first recess and the bottom surface of the first recess covers the through hole;
a semiconductor light emitting element configured to emit light that passes through the through hole and is used to irradiate the light-transmitting member; and
an optical system configured to condense the light from the semiconductor light emitting element and locally irradiate the light-transmitting member with the light.

2. The light emitting device according to claim 1, further comprising a high reflectance member configured to cover at least part of a side surface of the light-transmitting member.

3. The light emitting device according to claim 2, wherein the high reflectance member is a white resin.

4. The light emitting device according to claim 2, wherein:
the surface of the head portion includes a second recess including a bottom surface including the convex portion formed therein;
the bonding material bonds the part of the bottom surface of the second recess around the convex portion to the rear surface of the light-transmitting member while the convex portion is fitted to the first recess and the bottom surface of the first recess covers the through hole; and
the high reflectance member is disposed within a space surrounded by inner walls and the bottom surface of the second recess, and the side surface of the light-transmitting member.

5. The light emitting device according to claim 3, wherein:
the surface of the head portion includes a second recess including a bottom surface including the convex portion formed therein;
the bonding material bonds the part of the bottom surface of the second recess around the convex portion to the rear surface of the light-transmitting member while the convex portion is fitted to the first recess and the bottom surface of the first recess covers the through hole; and
the high reflectance member is disposed within a space surrounded by inner walls and the bottom surface of the second recess, and the side surface of the light-transmitting member.

6. The light emitting device according to claim 1, wherein the rear surface of the light-transmitting member includes a third recess configured to reflect light emitted from the semiconductor light emitting element and incident thereon in directions other than a direction in which the light is incident thereon.

7. The light emitting device according to claim 2, wherein the rear surface of the light-transmitting member includes a third recess configured to reflect light emitted from the semiconductor light emitting element and incident thereon in directions other than a direction in which the light is incident thereon.

8. The light emitting device according to claim 3, wherein the rear surface of the light-transmitting member includes a third recess configured to reflect light emitted from the semiconductor light emitting element and incident thereon in directions other than a direction in which the light is incident thereon.

9. The light emitting device according to claim 4, wherein the rear surface of the light-transmitting member includes a third recess configured to reflect light emitted from the semiconductor light emitting element and incident thereon in directions other than a direction in which the light is incident thereon.

10. The light emitting device according to claim 5, wherein the rear surface of the light-transmitting member includes a third recess configured to reflect light emitted from the semiconductor light emitting element and incident thereon in directions other than a direction in which the light is incident thereon.

11. The light emitting device according to claim 1, wherein the side surface of the light-transmitting member is inclined inward from the rear surface of the light-transmitting member to the front surface of the light-transmitting member.

12. The light emitting device according to claim 2, wherein the side surface of the light-transmitting member is inclined inward from the rear surface of the light-transmitting member to the front surface of the light-transmitting member.

13. The light emitting device according to claim 3, wherein the side surface of the light-transmitting member is inclined inward from the rear surface of the light-transmitting member to the front surface of the light-transmitting member.

14. The light emitting device according to claim 4, wherein the side surface of the light-transmitting member is inclined inward from the rear surface of the light-transmitting member to the front surface of the light-transmitting member.

15. The light emitting device according to claim 6, wherein the side surface of the light-transmitting member is inclined inward from the rear surface of the light-transmitting member to the front surface of the light-transmitting member.

16. The light emitting device according to claim 1, further comprising: a fixing unit arranged to surround the side surface of the light-transmitting member, and further configured to fix the light-transmitting member while being fitted to the side surface of the light-transmitting member.

17. The light emitting device according to claim 16, wherein the fixing unit is configured as part of the head portion.

18. The light emitting device according to claim 1, wherein the through hole increases in size from the surface of the head portion to the back surface of the head portion.

19. The light emitting device according to claim 1, wherein:
the light-transmitting member is a wavelength conversion member including a diffusion layer and a wavelength conversion layer;
the diffusion layer includes a first surface including the first recess formed therein and a second surface on an opposite side with respect to the first surface, and configured to diffuse the light from the semiconductor light emitting element with which the first surface is irradiated, so as to emit resultant light as diffusion light from the second surface;
the wavelength conversion layer includes a third surface joined to the second surface and a fourth surface on an opposite side with respect to the third surface, and is configured to convert a wavelength of the diffusion light incident on the third surface, so as to emit resultant light from the fourth surface; and
the bonding material bonds the part of the surface of the head portion around the convex portion to the first surface of the diffusion layer while the convex portion is fitted to the first recess and the bottom surface of the first recess covers the through hole.

20. The light emitting device according to claim 19, wherein a thickness of the diffusion layer is set so that the diffusion light emitted from the second surface has a generally uniform luminance distribution.

21. The light emitting device according to claim 1, wherein the optical system includes a condenser lens configured to condense the light from the semiconductor light emitting element, cause the light to pass through the through hole, and locally irradiate the light-transmitting member with the light.

22. The light emitting device according to claim 1, wherein the optical system includes a condenser lens configured to condense the light from the semiconductor light emitting element, and a light guide configured to guide the light from the semiconductor light emitting element condensed by the condenser lens and locally irradiate the light-transmitting member with the light.

23. A vehicle lamp comprising:
   the light emitting device according claim 1; and
   an optical system configured to control light from the light emitting device to irradiate light in front of a vehicle.

\* \* \* \* \*